(12) United States Patent
Kwean

(10) Patent No.: US 8,902,684 B2
(45) Date of Patent: Dec. 2, 2014

(54) INTEGRATED CIRCUIT, SYSTEM INCLUDING THE SAME, AND OPERATION METHOD OF THE SYSTEM

(75) Inventor: Ki-Chang Kwean, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 396 days.

(21) Appl. No.: 13/292,745

(22) Filed: Nov. 9, 2011

(65) Prior Publication Data
US 2013/0044553 A1    Feb. 21, 2013

(30) Foreign Application Priority Data
Aug. 16, 2011 (KR) .................. 10-2011-0081317

(51) Int. Cl.
*G11C 7/00* (2006.01)
*G11C 29/02* (2006.01)

(52) U.S. Cl.
CPC .................................. *G11C 29/023* (2013.01)
USPC ......... 365/194; 365/198; 365/233.1; 365/226

(58) Field of Classification Search
USPC ................ 365/194, 198, 233.1, 226; 327/538
See application file for complete search history.

(56) References Cited

U.S. PATENT DOCUMENTS

| 8,320,205 B2* | 11/2012 | Park .............................. 365/193 |
| 8,432,757 B2* | 4/2013 | Kim .............................. 365/198 |
| 2003/0133331 A1 | 7/2003 | LaBerge |
| 2009/0190414 A1 | 7/2009 | Ogasawara |
| 2011/0292708 A1* | 12/2011 | Kang et al. ...................... 365/63 |

* cited by examiner

*Primary Examiner* — Toan Le
(74) *Attorney, Agent, or Firm* — IP & T Group LLP

(57) ABSTRACT

A system includes a first chip configured to supply a training command and a second chip configured to transfer to the first chip a measured time for performing an operation in response to the training command.

30 Claims, 12 Drawing Sheets

… (1) …

INTEGRATED CIRCUIT, SYSTEM INCLUDING THE SAME, AND OPERATION METHOD OF THE SYSTEM

CROSS-REFERENCE TO RELATED APPLICATIONS

The present application claims priority of Korean Patent Application No. 10-2011-0081317, filed on Aug. 16, 2011, which is incorporated herein by reference in its entirety.

BACKGROUND

1. Field

Exemplary embodiments of the present invention relate to an integrated circuit chip, and more particularly, to a technology for setting an optimal latency for the performance of an integrated circuit chip.

2. Description of the Related Art

Integrated circuit chips communicate with neighboring chips by transmitting or receiving data or signals from neighboring chips. For example, when a memory controller applies a read command to a memory, the memory transfers stored data to the memory controller. Here, the memory may output the data to the memory controller with a delay, where, in response the read command, the delay may occur in retrieving the stored data and preparing for being output.

When a chip A and a chip B interact with each other, the chip A requests the chip B to perform a desired operation. There is a delay until the chip B performs the operation in response to the request from the chip A. This delay is referred to as latency. For example, when a CAS latency CL is set to 7 for commands between a memory and a memory controller and the memory controller applies a read command to the memory, the memory transfers a data to the memory controller after 7 clocks from the time that the read command is applied.

According to a recent trend, integrated circuit chips may operate may operate at several power supply voltage levels. However, when the power supply voltage for the operation of an integrated circuit chip is changed, the operation speed of the integrated circuit chip may change. Here, it is useful to optimally set the latency between chips despite changes in operation speeds.

SUMMARY

An embodiment of the present invention is directed to a configuration where a master chip applies an operation command to a slave chip and sets an optimal latency based on information related to the operation speed of the slave chip.

According to an example, the master chip may detect a change in the operation speed of the slave chip that originates from a change in the power supply voltage that is applied to the slave chip and set an optimal latency for each level of the power supply voltage at which the slave chip operates.

In accordance with an embodiment of the present invention, a system includes: a first chip configured to supply a training command; and a second chip configured to transfer to the first chip a measured time for performing an operation in response to the training command.

In accordance with another embodiment of the present invention, an integrated circuit chip includes: a decoder configured to generate a signal by decoding one or more command signals; an internal circuit configured to perform an operation corresponding to a training command; and a storage circuit configured to store a measured time for performing the operation.

In accordance with still another embodiment of the present invention, a method for operating an integrated circuit chip includes: supplying a first power supply voltage to the integrated circuit chip; outputting a training command to the integrated circuit chip while the integrated circuit chip operates with the first power supply voltage; measuring a first operation time of the integrated circuit chip for performing an operation corresponding to the training command; storing the first operation time; supplying a second power supply voltage to the integrated circuit chip; supplying the training command to the integrated circuit chip while the integrated circuit chip operates with the second power supply voltage; measuring a second operation time of the integrated circuit chip for performing an operation corresponding to the training command; and storing the second operation time.

In accordance with still another embodiment of the present invention, a memory system includes: a memory configured to transfer a measured data output time from a time when a training command is output to the memory to a time when data is output in response to the training command; and a memory controller configured to output the training command to the memory and receive the data from the memory.

In accordance with still another embodiment of the present invention, a memory includes: a cell array region configured to store data; a command decoder configured to output a training command by decoding one or more signals; a control circuit configured to generate a data output signal by delaying the training command; a data output circuit configured to output the data read from the cell array region in response to the data output signal; a measurement circuit configured to measure a data output time taken from a time when the training command is output to a time when the data is outputted from the data output circuit; and a storage circuit configured to store the measured data output time.

DETAILED DESCRIPTION

Figure 1:
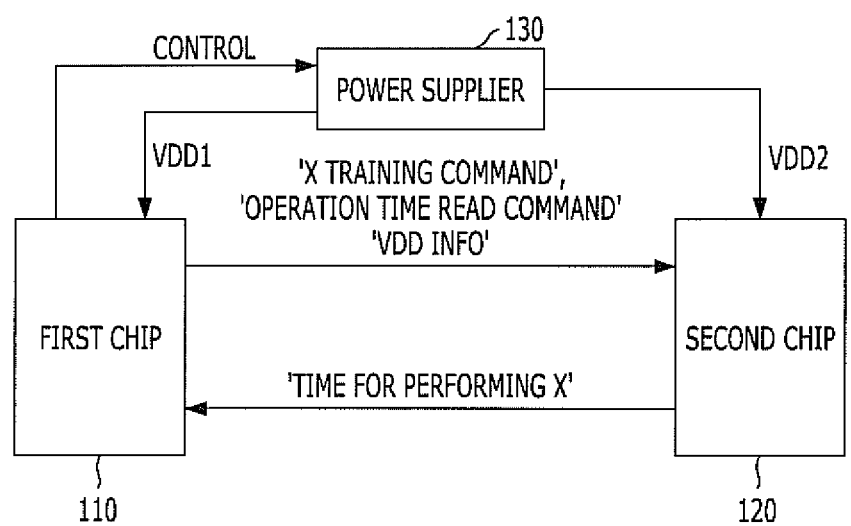
FIG. 1 is a block view illustrating an integrated circuit system including a first chip and a second chip in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block view illustrating an integrated circuit system including a first chip and a second chip in accordance with a first embodiment of the present invention.

Referring to FIG. 1, the integrated circuit system includes a first chip 110, a second chip 120, and a power supplier 130.

The first chip 110 is a master chip that commands the second chip 120 to perform a particular operation, and the second chip 120 is a slave chip that performs an operation corresponding to the command of the first chip 110. For example, the first chip 110 may be a memory controller and the second chip 120 may be a memory that performs a read operation or a write operation at the command of the memory controller.

The power supplier 130 provides the first chip 110 and the second chip 120 with power supply voltages VDD1 and VDD2. The level of the first power supply voltage VDD1 supplied from the power supplier 130 to the first chip 110 and the level of the second power supply voltage VDD2 supplied from the power supplier 130 to the second chip 120 may be the same or different from each other. The levels of the first and second power supply voltages VDD1 and VDD2 supplied by the power supplier 130 may be changed in response to control signals from the first chip 110. According to another example, the level of the first power supply voltage VDD1 provided from the power supplier 130 to the first chip 110 may be constant and the first chip 110 may control the power supplier 130 to change the level of the second power supply voltage VDD2 supplied to the second chip 120. In the drawings, 'CONTROL' means that the level of the power supply provided by the power supplier 130 is determined under the control of the first chip 110.

The first chip 110 outputs a training command to perform a training operation for an operation X to the second chip 120. Here, the operation X may be any operation performed by the second chip 120 upon receipt of the command from the first chip 110. This is denoted with an X training command in the drawing. The second chip 120, then, performs the operation X, measures the time taken for performing the operation X (referred to as a time for performing operation X), and transfers the measurement result to the first chip 110. This interaction between the first chip 110 and the second chip 120 is repeated while changing the level of the second power supply voltage VDD2 applied to the second chip 120. The first chip 110 then may determine how the time for performing time for performing operation X for the second chip 120 is changed according to the second power supply voltage VDD2.

The second chip 120 may transfer a signal corresponding to the 'time for performing operation X' to the first chip 110 in the following two methods.

(1) Whenever the first chip 110 applies an X training command to the second chip 120, the second chip 120 measures a time for performing operation X, and transfers the 'time for performing operation X' to the first chip 110. In other words, even without a separate command from the first chip 110 to the second chip 120 to transfer a signal corresponding to the time for performing operation X, the second chip 120 automatically transfers the time for performing operation X to the first chip 110 when the second chip 120 finishes measuring its time for performing operation X.

(2) When the first chip 110 applies an X training command to the second chip 120, the second chip 120 measures the time for performing operation X and internally stores the measured time for performing operation X, and when the first chip 110 transmits an operation time read command to the second chip 120 to transmit the time for performing operation X, the second chip 120 transfers the stored time for performing operation X.

The following Table 1 exemplarily shows a time for performing operation X that is measured according to the level of the second power supply voltage VDD2. In Table 1, the unit of the time for performing operation X may be any reasonably suitable unit of time for quantifying time. For example, the unit may be ms, μs, or the number of clocks.

TABLE 1

| Second power supply voltage (VDD2) | Time for performing operation X in arbitrary units of time |
|---|---|
| 1.0 V | 13 units |
| 1.1 V | 12 units |
| 1.2 V | 10 units |
| 1.3 V | 9 units |

When the first chip 110 receives the information shown in Table 1, the first chip 110 may determine the time for performing operation X for the second chip 120. Therefore, the first chip 110 may easily control the latency for the operation X of the second chip 120. For example, when the second power supply voltage VDD2 of the second chip 120 is 1.0V, the first chip 110 sets the latency for the operation X of the second chip 120 to a value of 9 units or more. Here, the latency for operation X means the total time taken for the second chip 120 to transfer the result value of the operation X to the first chip 110 from the time when the first chip 110 commands the second chip 120 to perform the operation X. When the second power supply voltage VDD2 of the second chip 120 is 1.3V, the first chip 110 sets the latency for the operation X of the second chip 120 to a value of 6 units or more. Here, even if the second power supply voltage VDD2 for the second chip 120 is changed, the first chip 110 may consistently optimize the latency value for the operation X of the second chip 120.

In FIG. 1, information transferred between the first chip 110 and the second chip 120 for the purpose of determining by the first chip 110 the a time for performing operation X of the second chip 120 is illustrated. An 'X training command' and an 'operation time read command' that are transmitted from the first chip 110 to the second chip 120 may be transferred through a command channel or a control channel including a plurality of signal lines, and the 'time for performing operation X' that is transferred from the second chip 120 to the first chip 110 may be transferred through a data channel or a control channel. Here, regardless of the types of data or control channels, the 'X training command' and the 'operation time read command' are transferred from the first chip 110 to the second chip 120, and the 'time for performing operation X' is transferred from the second chip 120 to the first chip 110.

Power supply voltage level information 'VDD INFO' transferred from the first chip 110 to the second chip 120 in FIG. 1 is the information on the level of the second power supply voltage VDD2 currently applied to the second chip 120.

Figure 2:
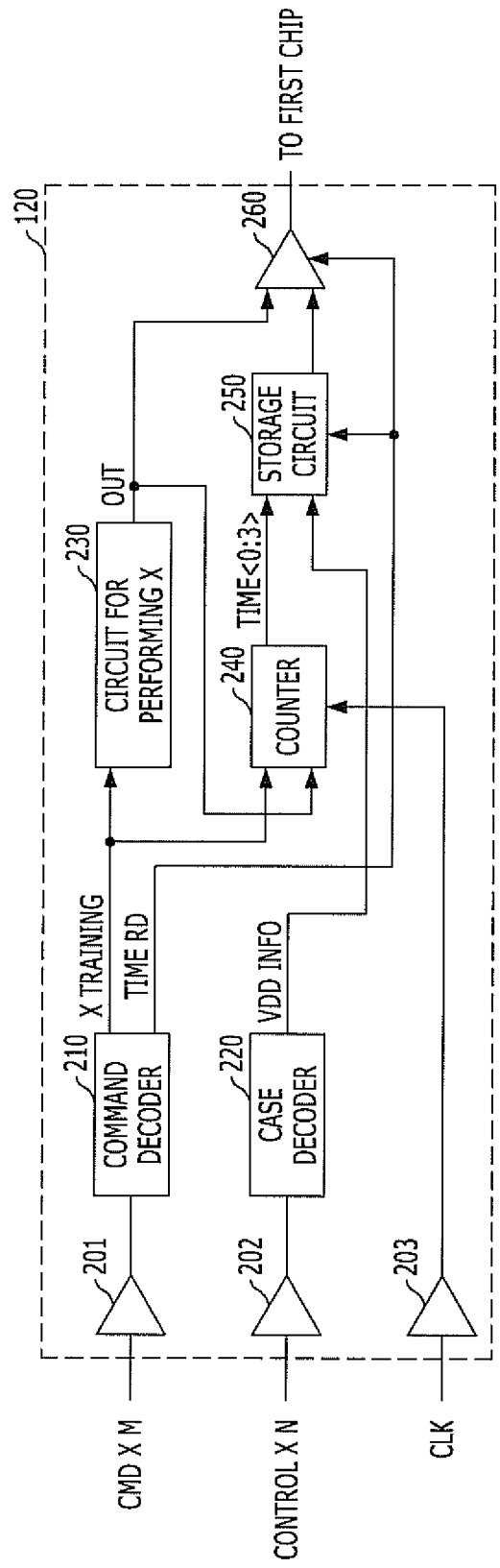
FIG. 2 is a block view illustrating the second chip 120 shown in FIG. 1.

FIG. 2 is a block view illustrating the second chip 120 shown in FIG. 1.

Referring to FIG. 2, the second chip 120 includes buffers 201-203, a command decoder 210, a case decoder 220, an circuit 230 for performing operation X, a counter 240, a storage circuit 250, and an output circuit 260.

The buffers 201-203 receive signals transferred from the outside of the second chip 120. The first buffer 201 receives one or more command signals CMD transferred from the first chip 110. In the drawings, 'X M' indicates that there are M number of command signals. The second buffer 202 receives one or more control signals transferred from the first chip 110. In the drawings, 'X N' indicates that there are N number of control signals. The third buffer 203 receives a clock CLK transferred from the first chip 110 or another external chip.

The command decoder 210 outputs an 'X training command' to perform a training operation for an operation X by decoding the one or more command signals CMD inputted through the first buffer 201. Also, the command decoder 210 outputs an operation time read command 'TIME RD' by decoding the one or more command signals CMD inputted through the first buffer 201. The command decoder 210 decodes not only the X training command and the operation time read command TIME RD but also the commands directing operations to be performed by the second chip 120, such as a command directing to perform an operation X. However, to the extent that their further description is not necessary for explaining exemplary embodiments of the present invention, those commands are not illustrated in the drawings.

The case decoder 220 outputs power supply voltage level information 'VDD INFO' which indicates the level of the second power supply voltage VDD2 currently applied to the second chip 120 by decoding one or more control signals inputted through the second buffer 202.

The circuit 230 for performing operation X is a circuit that performs the operation X at the command of the first chip 110. When the command decoder 210 outputs the X training command, the circuit 230 for performing operation X performs the operation X. In other words, the circuit 230 for performing operation X performs the same operation when the command decoder 210 outputs a command directing to perform the operation X and when the command decoder 210 outputs the X training command. A signal outputted from the circuit 230 for performing operation X is a result obtained from the circuit 230 for performing operation X after the performance of the operation X in response to the X training command. For example, if the circuit 230 for performing operation X is a circuit for performing an operation based on a particular equation, the circuit 230 for performing operation X initiates the operation based on the particular equation when the X training command is received. When the circuit 230 for performing operation X finishes the operation, the circuit 230 for performing operation X outputs the result of the operation as an output signal OUT. The circuit 230 for performing operation X operates in the same way when the command decoder 210 outputs a command to perform the operation X.

The counter 240 is a circuit for measuring the time for performing operation X of the circuit 230 for performing operation X. The counter 240 counts the number of times that the clock CLK is enabled from the time when the X training command is enabled to the time when the output signal OUT of the circuit 230 for performing operation X is outputted, and generates time information TIME<0:3>. Here, according to an example, the time information TIME<0:3> is 4 bits.

The storage circuit 250 stores the time information TIME<0:3> measured in the counter 240. The storage circuit 250 also receives the power supply voltage level information VDD INFO and the storage circuit 250 may match the time information TIME<0:3> to the power supply voltage level information VDD INFO and store both information. In other words, the time for performing operation X TIME<0:3> and the power supply voltage information as shown in Table 1 may be matched to each other and together stored in the storage circuit 250. When the operation time read command TIME RD is transferred to the storage circuit 250, the information stored in the storage circuit 250 is transferred to the output circuit 260, and the output circuit 260 in turn transfers the information to the first chip 110. During a normal operation (that is, not a training operation), the output circuit 260 transfers the output signal OUT generated as a result of performing the operation X in the circuit 230 for performing operation X to the first chip 110.

Figure 3:
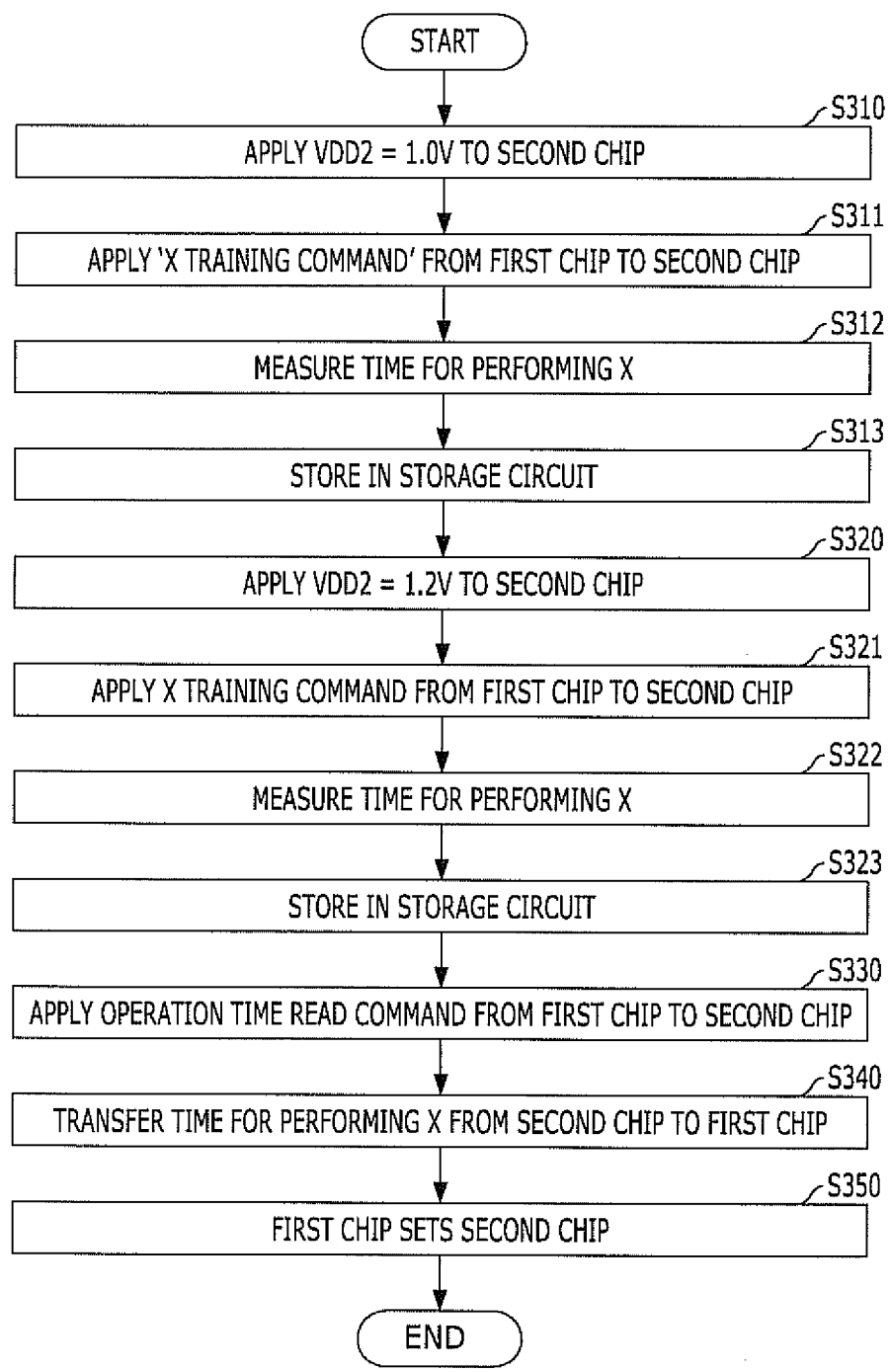
FIG. 3 is a flowchart illustrating the operation of the integrated circuit system shown in FIGS. 1 and 2.

FIG. 3 is a flowchart illustrating the operation of the integrated circuit system shown in FIGS. 1 and 2. Referring to FIG. 3, the overall operation of the integrated circuit system shown in FIGS. 1 and 2 is described.

In step S310, the second power supply voltage VDD2 of a first level, e.g., 1.0V, is applied to the second chip 120. As described above, the level of the second power supply voltage VDD2 applied to the second chip 120 is determined by the first chip 110 controlling the power supplier 130.

While the second chip 120 operates with the second power supply voltage VDD2 of the first level, e.g., 1.0V, the processes of steps S311 to S313 are performed. In step S311, an X training command that instructs a measurement of the time for performing operation X is applied from the first chip 110 to the second chip 120. In step S312, the second chip 120 internally performs the operation X and measures the time for performing operation X. As described earlier with reference to FIG. 2, the time for performing operation X is measured from the time when the X training command is applied to the time when the output signal OUT of the circuit 230 for performing operation X is outputted. In step S313, the time for performing operation X which is measured in the step S312 is stored in the storage circuit 250 in the inside of the second chip 120. At this time, the operation of measuring how much time is taken for the second chip 120 to perform the operation X at the second power supply voltage VDD2 of the first level, e.g., 1.0V, terminates.

In step S320, the level of the second power supply voltage VDD2 applied to the second chip 120 is changed from the first level, e.g., 1.0V, to a second level, e.g., 1.2V. The change in the level of the second power supply voltage VDD2 applied to the second chip 120 is controlled by control signals/command from the first chip 110 to the power supplier 130.

Here, when the second chip 120 operates with the second power supply voltage VDD2 of the second level, e.g., 1.2V, the processes of steps S321 to S323 are carried out. In step S321, an X training command that instructs a measurement of the time for performing operation X is applied from the first chip 110 to the second chip 120. In step S322, the second chip 120 internally performs the operation X and measures the time for performing operation X. In step S323, the time for performing operation X which is measured in the step S322 is stored in the storage circuit 250 in the inside of the second chip 120. At this time, the operation of measuring how much time is taken for the second chip 120 to perform the operation X at the second power supply voltage VDD2 of the second level, e.g., 1.2V, terminates.

In step S330, an operation time read command TIME RD is applied from the first chip 110 to the second chip 120. In step S340, the time for performing operation X at each level of the second power supply voltage VDD2 is transferred from the second chip 120 to the first chip 110 in response to the operation time read command TIME RD. Here, the information shown in Table 1 is transferred from the second chip 120 to the first chip 110.

In step S350, based on the information transferred from the second chip 120, the first chip 110 sets parameters on the operation X of the second chip 120. For example, when the second power supply voltage VDD2 is at the level of 1.0V, the first chip 110 may set the latency for the operation X of the second chip 120 to 8 units. When the second power supply voltage VDD2 is at the level of 1.2V, the first chip 110 may set the latency for the operation X of the second chip 120 to 6 units.

Although FIG. 3 illustrates an example of measuring the time for performing operation X of the second chip 120 at the second power supply voltage VDD2 of two levels, the time for performing operation X of the second chip 120 may be measured at the second power supply voltage VDD2 of more than the two levels. Here, the operation illustrated in FIG. 3 may improve the control of the first chip 110 on the second chip 120 by determining the performance of the second chip 120 at each level of the second power supply voltage VDD2. According to an example, the operation of FIG. 3 may be performed in the initial stage of the interaction between the first chip 110 and the second chip 120.

Figure 4:
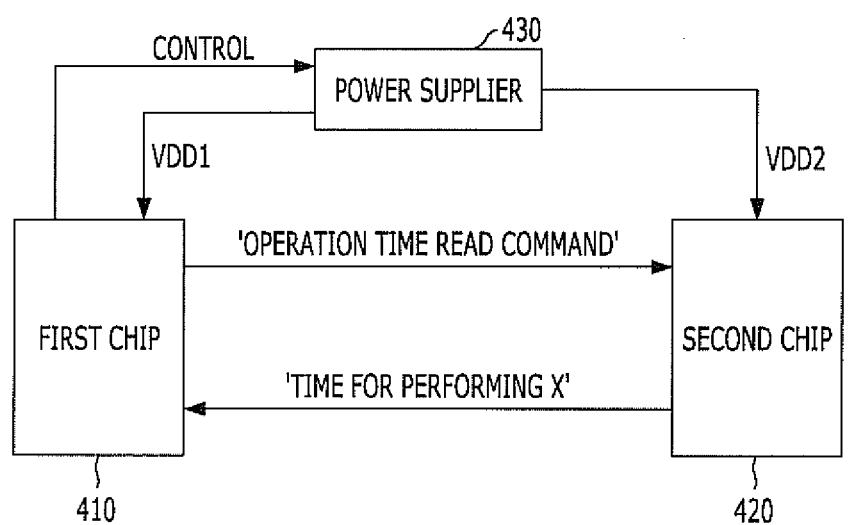
FIG. 4 is a block view illustrating an integrated circuit system including a first chip and a second chip in accordance with a second embodiment of the present invention.

FIG. 4 is a block view illustrating an integrated circuit system including a first chip 410 and a second chip 420 in accordance with a second embodiment of the present invention.

In this embodiment shown in FIG. 4, the time for performing operation X of the second chip 420 is not measured, and the time for performing operation X is already stored in the second chip 420 and the stored information is transferred to the first chip 410.

Referring to FIG. 4, the integrated circuit system includes the first chip 410, the second chip 420, and a power supplier 430.

The first chip 410 is a master chip that commands the second chip 420 to perform a particular operation, and the second chip 420 is a slave chip that performs an operation corresponding to the commands from the first chip 410. For example, the first chip 410 may be a memory controller and the second chip 420 may be a memory that performs a read operation or a write operation at the command of the memory controller.

The power supplier 430 provides the first chip 410 and the second chip 420 with power supply voltages VDD1 and VDD2. The level of the first power supply voltage VDD1 supplied from the power supplier 130 to the first chip 410 and the level of the second power supply voltage VDD2 supplied from the power supplier 430 to the second chip 420 may be the same or different from each other. The levels of the first and second power supply voltages VDD1 and VDD2 supplied by the power supplier 430 to the first chip 410 and the second chip 420 may be changed by the first chip 410. According to another example, the level of the first power supply voltage VDD1 provided from the power supplier 430 to the first chip 410 may be a constant voltage and the first chip 410 may change the level of the second power supply voltage VDD2 provided from the power supplier 430 to the second chip 420. In the drawings, 'CONTROL' means that the level of the power supply provided by the power supplier 430 is determined under the control of the first chip 410.

The first chip 410 transfers an 'operation time read command' which requests the second chip 420 for information on the time taken for performing operation X, which may be any operation performed by the second chip 420 at the command of the first chip 410. The second chip 420, then, transfers its stored information on the time for performing operation X. The time for performing operation X that is transferred from the second chip 420 to the first chip 410 may be the same information matched with the second power supply voltage VDD2 as shown in Table 1. The first chip 410 receives the time for performing operation X and determines the performance of the second chip 420 for each level of the second power supply voltage VDD2 that is applied to the second chip 420, and the first chip 410 controls the second chip 420 based on the determined performance.

The second chip 420 stores the time for performing operation X for each level of the second power supply voltage VDD2. According to an example, tests may be performed after the second chip 420 is fabricated and the operation X of the second chip 420 is tested, and the manufacturers may store in the second chip 420 information as to how long it takes for the second chip 420 to perform the operation X for each level of the second power supply voltage VDD2.

Figure 5:
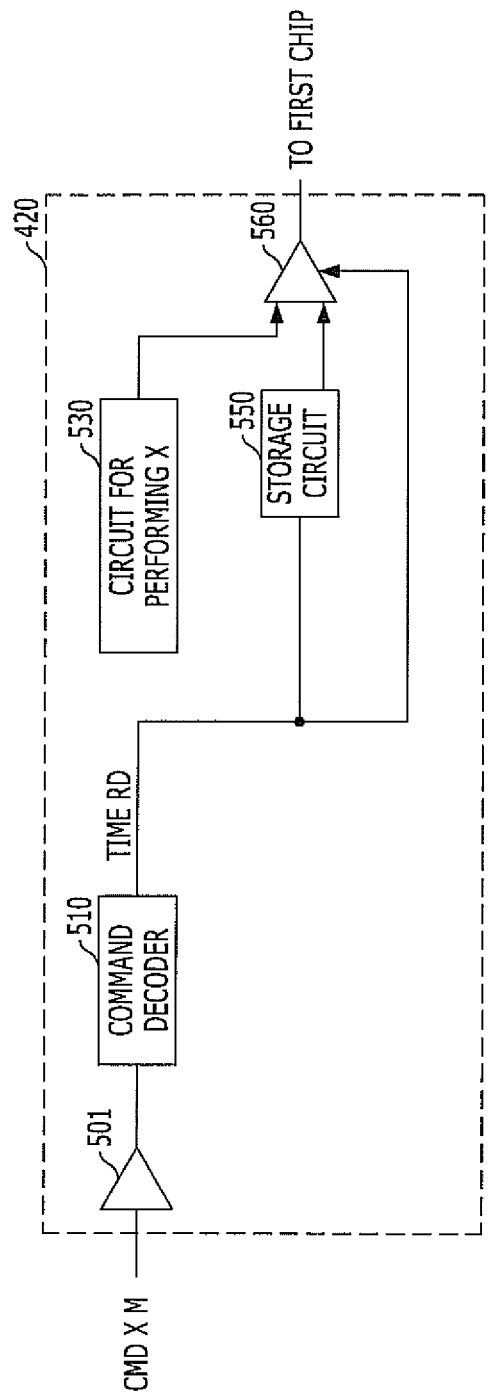
FIG. 5 is a block view illustrating the second chip 420 shown in FIG. 4.

FIG. 5 is a block view illustrating the second chip 420 shown in FIG. 4.

Referring to FIG. 5, the second chip 420 includes a buffer 501, a command decoder 510, a circuit S30 for performing operation X, a storage circuit 550, and an output circuit 560.

The buffer 501 receives one or more command signals CMD transferred from the first chip 410. In the drawings, 'X M' indicates that there are M number of command signals.

The command decoder 510 outputs an 'operation time read command TIME RD' which requests for information on the time taken for performing operation X for the second chip 420 by decoding the one or more command signals CMD inputted through the buffer 501. The command decoder 210 outputs not only the operation time read command TIME RD but also many other commands directing operations to be performed by the second chip 420. However, to the extent that their further description is not necessary for explaining exemplary embodiments, those commands are not illustrated in the drawings.

The circuit S30 for performing operation X is a circuit that performs the operation X at the command of the command decoder 510. 'Operation X' in the drawings shows an operation X in response to a command output from the command decoder 510 being transferred to the circuit S30 for performing operation X.

The storage circuit 550 stores the information on the time for performing operation X according to each level of the second power supply voltage VDD2 that is applied to the second chip 420, where, for example, the time may be measured and stored by a manufacturer as discussed above. Here, the storage circuit 550 stores the information shown in Table 1. When the command decoder 510 outputs the operation time read command TIME RD, the information stored in the storage circuit 550 is transferred to the first chip 410 through the output circuit 560. During a normal operation (that is, not a training operation), the output circuit 560 may transfer the output signal OUT generated as a result of performing the operation X in the circuit S30 for performing operation X to the first chip 410.

Figure 6:
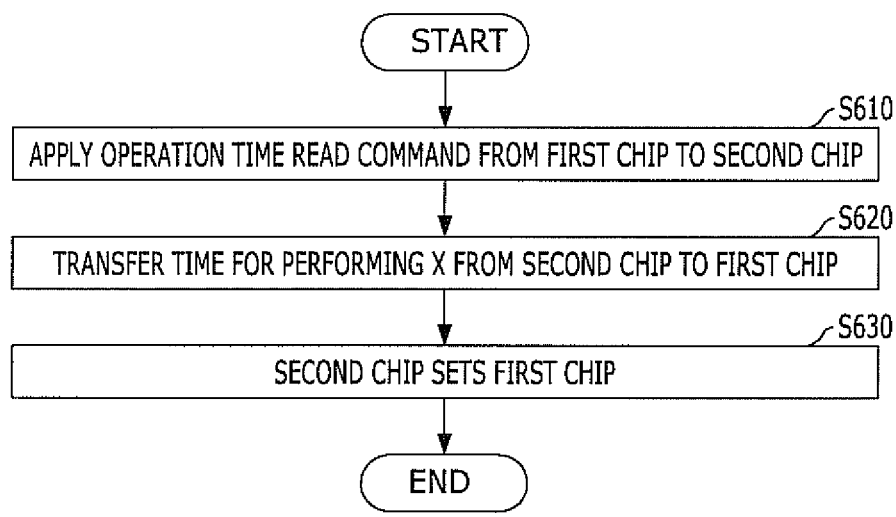
FIG. 6 is a flowchart illustrating the operation of the integrated circuit system shown in FIGS. 4 and 5.

FIG. 6 is a flowchart illustrating an operation of the integrated circuit system shown in FIGS. 4 and 5. Referring to FIG. 6, the overall operation of the integrated circuit system is described.

In step S610, an operation time read command TIME RID is applied from the first chip 410 to the second chip 420. In step S620, the information stored in the storage circuit 550 (where, for example, the information can be measured and detected by manufacturers as described above) of the second chip 420 is transferred to the first chip 410 in response to the operation time read command TIME RD.

In step S630, based on the information transferred from the second chip 420, the first chip 410 sets parameters for the operation X of the second chip 420. For example, when the second power supply voltage VDD2 is at the level of 1.0V, the first chip 410 may set the latency for the operation X of the second chip 420 to 8 units. When the second power supply voltage VDD2 is at the level of 1.2V, the first chip 410 may set the latency for the operation X of the second chip 420 to 6 units.

Figure 7:
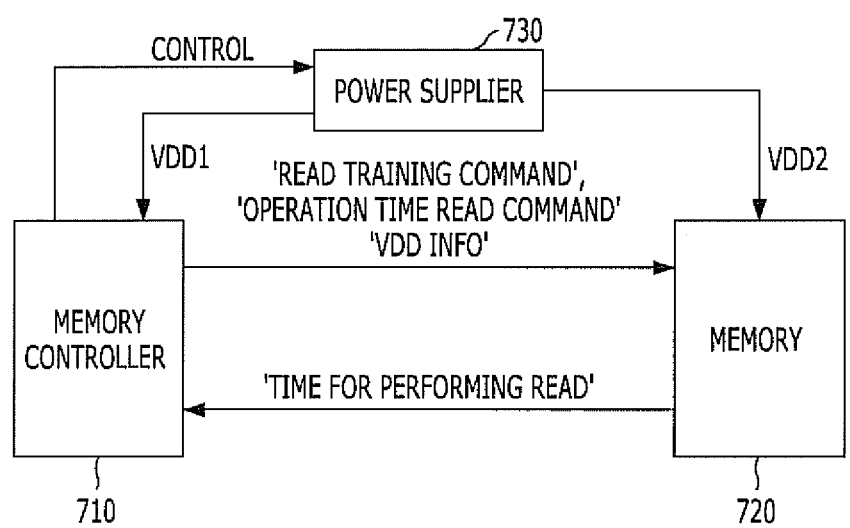
FIG. 7 is a block view illustrating a memory system in accordance with a first embodiment of the present invention.

FIG. 7 is a block view illustrating a memory system in accordance with a first embodiment of the present invention.

The memory system of FIG. 7 corresponds to the integrated circuit system of FIG. 1. The first chip 110 corresponds to a memory controller 710, and the second chip 120 corresponds to a memory 720. To the extent that there is no conflict, the same description for the time for performing operation X to be measured as described in connection with FIG. 1 applies to a time for performing a read operation as will be described in connection with FIG. 7.

Referring to FIG. 7, the memory system includes a memory controller 710, a memory 720, and a power supplier 730.

The memory controller 710 controls the memory 720 by applying commands, addresses, and data to the memory 720. The memory 720 stores the data and transfers the stored data to the memory controller 710 under the control of the memory controller 710.

The power supplier 730 provides the memory controller 710 and the memory 720 with power supply voltages VDD1 and VDD2. The level of the first power supply voltage VDD1 supplied from the power supplier 730 to the memory controller 710 and the level of the second power supply voltage VDD2 supplied from the power supplier 730 to the memory 720 may be the same or different from each other. The levels of the first and second power supply voltages VDD1 and VDD2 supplied by the power supplier 730 may be changed by the memory controller 710. According to another example, the level of the first power supply voltage VDD1 provided from the power supplier 730 to the memory controller 710 may be constant and the memory controller 710 may change the level of the second power supply voltage VDD2 provided from the power supplier 730 to the memory 720. In the drawings, 'CONTROL' means that the level of the second power supply VDD2 provided by the power supplier 730 is determined under the control of the memory controller 710.

The memory controller 710 applies a training command for commanding to perform a training operation for a read operation to the memory 720. Here, the training command is denoted as a "read training command" in the drawings. The memory 720, then, performs the read operation, measures the time for performing a read operation, and transfers the measurement result to the memory controller 710. This interaction between the memory controller 710 and the memory 720 is repeated while the level of the second power supply voltage VDD2 applied to the memory 720 is changed. The memory controller 710 determines how the time for performing a read operation for the memory 720 is changed according to the second power supply voltage VDD2.

The memory 720 may transfer the 'time for performing a read operation' to the memory controller 710 in the following two methods.

(1) Whenever the memory controller 710 applies a read training command to the memory 720, the memory 720 measures the time for performing a read operation, and transfers the 'time for performing a read operation' to the memory controller 710. In other words, although the memory controller 710 does not separately request the memory 720 for the time for performing a read operation, the memory 720 automatically transfers the time for performing a read operation to the memory controller 710 when the memory 720 finishes measuring the time for performing a read operation.

(2) When the memory controller 710 applies a read training command to the memory 720, the memory 720 measures the time for performing a read operation and internally stores the measured time for performing a read operation, and when the memory controller 710 requests the memory 720 for the time for performing a read operation (that is, when the memory controller 710 applies an operation time read command to the memory 720), the memory 720 transfers the stored time for performing a read operation.

The following Table 2 exemplarily shows time for performing a read operation that is measured according to the level of the second power supply voltage VDD2. In Table 2, the unit of the time for performing a read operation is the number of clocks. Here, the time for performing a read operation means address access time tAA, which indicates a time from the time when the read command is applied to the time when the memory 720 is capable of outputting a corresponding data.

TABLE 2

| Second power supply voltage (VDD2) | Time for performing a read operation |
| --- | --- |
| 1.0 V | 13 |
| 1.1 V | 11 |
| 1.2 V | 9 |
| 1.3 V | 7 |

When the memory controller 710 receives the information shown in Table 2, the memory controller 710 may determine the time for performing a read operation for the memory 720. Therefore, the memory controller 710 may easily control the latency for the read operation of the memory 720. For example, when the second power supply voltage VDD2 of the memory 720 is 1.1V, the memory controller 710 sets the latency for the read operation of the memory 720 to 11 clocks. When the second power supply voltage VDD2 of the memory 720 is 1.3V, the memory controller 710 sets the latency for the read operation of the memory 720 to 7 clocks. Here, although the second power supply voltage VDD2 of the memory 720 is changed, the memory controller 710 may consistently optimize the CAS latency for the read operation of the memory 720.

In FIG. 7, information to be transferred between the memory controller 710 and the memory 720 for the memory controller 710 to determine the time for performing a read operation of the memory 720 in the memory controller 710 is illustrated. A 'read training command' and an 'operation time read command' that are applied from the memory controller 710 to the memory 720 may be transferred through a command channel, and the 'time for performing a read operation' that is transferred from the memory 720 to the memory controller 710 may be transferred through a data channel. Power supply voltage level information 'VDD INFO' transferred from the memory controller 710 to the memory 720 in FIG. 7 is the information on the level of the second power supply voltage VDD2 applied to the memory 720 at present. The power supply voltage level information may be transferred through an address channel.

Figure 8:
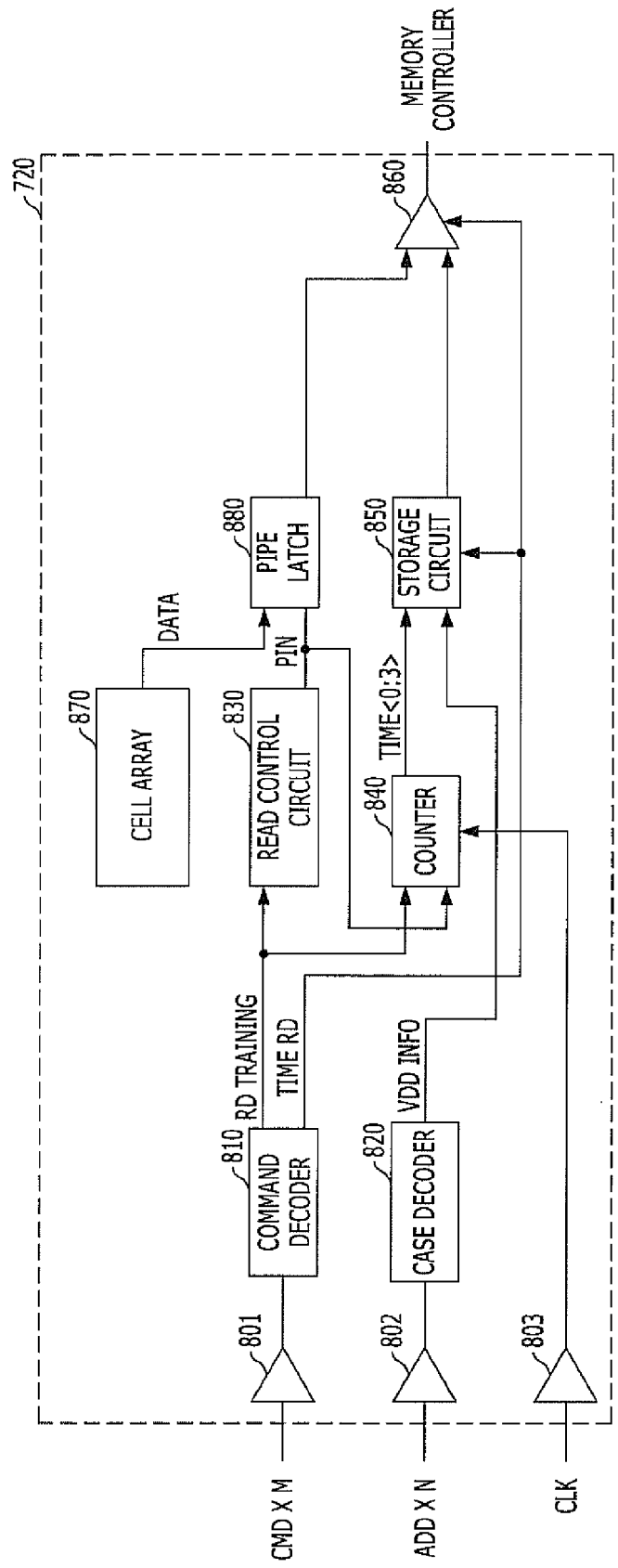
FIG. 8 is a block view illustrating a memory 720 shown in FIG. 7.

FIG. 8 is a block view illustrating the memory 720 shown in FIG. 7.

Referring to FIG. 8, the memory 720 includes buffers 801, 802 and 803, a command decoder 810, a case decoder 820, a read control circuit 830, a counter 840, a storage circuit 850, an output circuit 860, a cell array 870, and a pipe latch 880.

The buffers 801, 802 and 803 receive signals transferred from the memory controller 710. The first buffer 801 receives one or more command signals CMD transferred from the memory controller 710. In the drawing, 'X M' indicates that there are M number of command signals. The second buffer 802 receives one or more address signals ADD transferred from the memory controller 710. In the drawing, 'X N' indicates that there are N number of address signals. The third buffer 803 receives a clock CLK transferred from the memory controller 710.

The command decoder 810 outputs a 'read training command' for performing a training operation for a read operation by decoding the one or more command signals CMD inputted through the first buffer 801. Also, the command decoder 810 outputs an 'operation time read command TIME RD' by decoding the one or more command signals CMD inputted through the first buffer 801. The command decoder 810 decodes not only the read training command and the operation time read command TIME RD but also the commands controlling different operations to be performed by the memory 720, such as a normal read operation, active operation, write operation and so forth. However, to the extent that their further description is not necessary for explaining exemplary embodiments, those commands are not illustrated in the drawings.

The case decoder 820 outputs power supply voltage level information 'VDD INFO' which indicates the level of the second power supply voltage VDD2 currently applied to the memory 720 by decoding one or more address signals ADD inputted through the second buffer 802.

The read control circuit 830 is a logic circuit for inputting data that is read out of the cell array 870 to the pipe latch 880 by delaying a read command (or a train command) when the memory controller 710 commands to perform a read operation. Here, the read control circuit 830 is a circuit for generating a control signal related to a read operation. When the read control circuit 830 outputs the read training command, the read control circuit 830 performs the read operation. Here, the read control circuit 830 performs the same operation when the command decoder 810 outputs a command directing to perform a read operation and when the command decoder 810 outputs the read training command.

The counter 840 is a circuit for measuring the time for performing a read operation of the read control circuit 830. The counter 840 counts the number of times that the clock CLK is enabled from the time when the read training command is enabled to the time when the output signal OUT of the read control circuit 830, which is a pipe input signal PIN, is enabled, and generates time information TIME<0:3>. According to an example, the time information TIME<0:3> is 4 bits.

The pipe latch 880 stores the data that is read out of the cell array 870 during a read operation. The pipe latch 880 is a circuit that arrays the data in the form for being outputted. Since the pipe latch 880 operates in synchronization with a clock CLK, the time that an output data stays in the pipe latch 880 is constant at all times. Thus, the change in the level of the second power supply voltage VDD2 that is applied to the memory 720 does not affect the operation time of the pipe latch 880.

The storage circuit 850 stores the time information TIME<0:3> measured in the counter 840. The storage circuit 850 also receives the power supply voltage level information VDD INFO and the storage circuit 850 may match the time information TIME<0:3> to the power supply voltage level information VDD INFO and store them. Here, the information as shown in Table 2 may be matched and stored in the storage circuit 850. The time for performing a read operation of the memory 720 ranges from the time when the memory 720 receives the read command to the time when the operations of the read control circuit 830 and the pipe latch 880 terminate. The storage circuit 850 may store a value obtained by summing the time information TIME<0:3> measured in the counter 840, which indicates the operation time of the read control circuit 830, and the operation time of the pipe latch 880, which is a constant value as described above.

When the operation time read command TIME RD is transferred to the storage circuit 850, the information stored in the storage circuit 850 is transferred to the output circuit 860, and the output circuit 860 transfers the information to the memory controller 710. During a normal operation (that is, not a training operation), the output circuit 860 outputs the data that are outputted from the cell array 870 and arrayed by the pipe latch 880.

Figure 9:
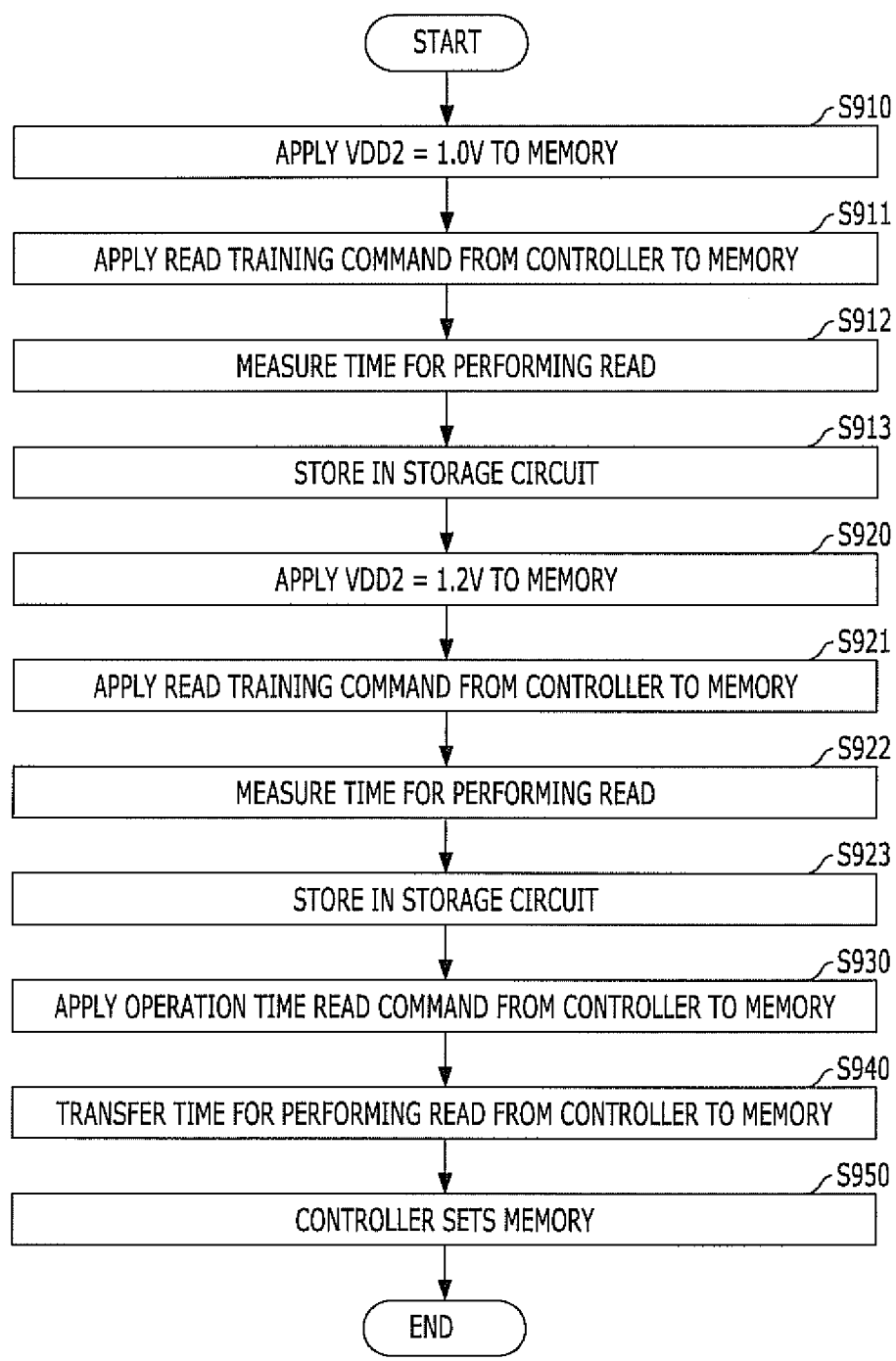
FIG. 9 is a flowchart illustrating the operation of the memory system shown in FIGS. 7 and 8.

FIG. 9 is a flowchart illustrating the operation of the memory system shown in FIGS. 7 and 8. Referring to FIG. 9, the overall operation of the memory system shown in FIGS. 7 and 8 is described.

In step S910, the second power supply voltage VDD2 of a first level, e.g., 1.0V, is applied to the memory 720. As described above, the level of the second power supply voltage VDD2 applied to the memory 720 is determined based on the memory controller 710 controlling the power supplier 730.

While the memory 720 operates with the second power supply voltage VDD2 of the first level, e.g., 1.0V, the processes of steps S911 to S913 are performed. In step S911, a read training command that instructs a measurement of the time for performing a read operation is applied from the memory controller 710 to the memory 720. The read training command may be applied as a single command, or it may be applied after the memory controller 710 controls the memory 720 to enter into a training mode. For example, the read training command may be a read command that is applied to the memory 720 after the memory 720 enters into a training mode.

In step S912, the memory 720 internally performs the read operation and measures the time for performing a read operation in response to the read training command that is applied in the step S911. As described earlier with reference to FIG. 8, the time for performing a read operation is measured from the time when the read training command is applied to the time when the output signal OUT of the read control circuit 830, which is the pipe input signal, is output (for example, enabled). In step S913, the time for performing a read operation which is measured in the step S912 is stored in the storage circuit 850 in the inside of the memory 720. At this time, the operation of measuring how much time is taken for the memory 720 to perform the read operation at the second power supply voltage VDD2 of the first level, e.g., 1.0V, terminates.

In step S920, the level of the second power supply voltage VDD2 applied to the memory 720 is changed from the first level, e.g., 1.0V, to a second level, e.g., 1.2V. The change in the level of the second power supply voltage VDD2 applied to the memory 720 may be performed as the memory controller 710 controls the power supplier 730.

When the memory 720 operates with the second power supply voltage VDD2 of the second level, e.g., 1.2V, the processes of steps S921 to S923 are carried out. In step S921, a read training command that instructs a measurement of the time for performing a read operation is applied from the memory controller 710 to the memory 720. In step S922, the memory 720 internally performs the read operation and measures the time for performing a read operation. In step S923, the time for performing a read operation which is measured in the step S922 is stored in the storage circuit 850 in the inside of the memory 720. At this time, the operation of measuring how much time is taken for the memory 720 to perform the read operation at the second power supply voltage VDD2 of the second level, e.g., 1.2V, terminates.

In step S930, an operation time read command TIME RD is applied from the memory controller 710 to the memory 720. In step S940, the time for performing a read operation at each level of the second power supply voltage VDD2 is transferred from the memory 720 to the memory controller 710 in response to the operation time read command TIME RD. Here, the information shown in Table 2 is transferred from the memory 720 to the memory controller 710.

In step S950, based on the information transferred from the memory 720, the memory controller 710 sets parameters on the read operation of the memory 720. For example, when the second power supply voltage VDD2 is at the level of 1.0V, the memory controller 710 may set the latency for the read operation of the memory 720, which is CAS latency, to 13 clocks. When the second power supply voltage VDD2 is at the level of 1.2V, the memory controller 710 may set the latency for the read operation of the memory 720 to 9 clocks.

Although FIG. 9 illustrates an example of measuring the time for performing a read operation of the memory 720 at the second power supply voltage VDD2 of two levels, the time for performing a read operation of the memory 720 may be measured at the second power supply voltage VDD2 of more than the two levels. Also, the operation illustrated in FIG. 9 may improve the control of the memory controller 710 on the memory 720 by determining the read operation performance of the memory 720 at each level of the second power supply voltage VDD2. According to an example, the operation of FIG. 9 may be performed in the initial stage of the interaction between the memory controller 710 and the memory 720.

Figure 10:
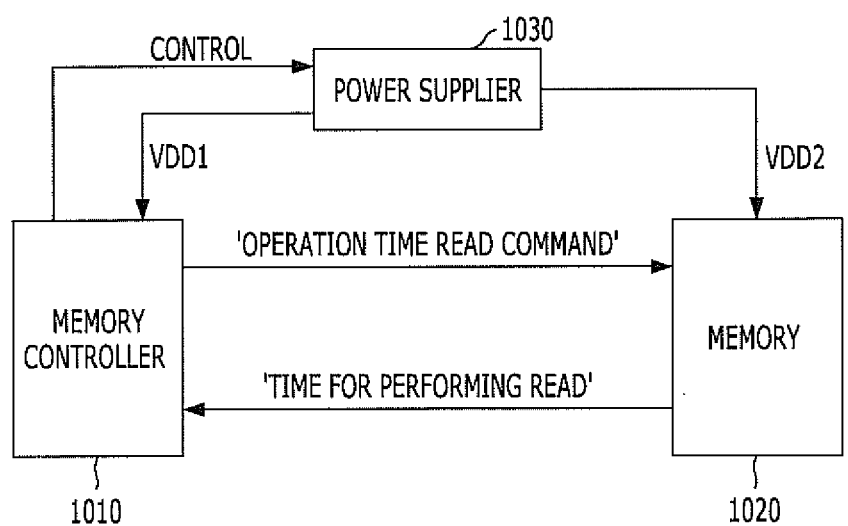
FIG. 10 is a block view illustrating a memory system in accordance with a second embodiment of the present invention.

FIG. 10 is a block view illustrating a memory system in accordance with a second embodiment of the present invention.

In this embodiment shown in FIG. 10, the time for performing a read operation of the memory 1020 is not measured by the memory 1020, and the time for performing a read operation is already stored in the memory 1020 (for example, may be measured and stored by manufacturers) and the stored information is transferred to the memory controller 1010.

Referring to FIG. 10, the memory 720 includes the memory controller 1010, the memory 1020, and a power supplier 1030.

The memory controller 1010 controls the memory 1020 by applying commands, addresses, and data. The memory 1020 stores the data and transfers the stored data to the memory controller 1010 under the control of the memory controller 1010.

The power supplier 1030 provides the memory controller 1010 and the memory 1020 with power supply voltages VDD1 and VDD2. The level of the first power supply voltage VDD1 supplied from the power supplier 1030 to the memory controller 1010 and the level of the second power supply voltage VDD2 supplied from the power supplier 1030 to the memory 1020 may be the same or different from each other. The levels of the first and second power supply voltages VDD1 and VDD2 supplied by the power supplier 1030 to the memory controller 1010 and the memory 1020 may be changed by the memory controller 1010. According to another example, the level of the first power supply voltage VDD1 provided from the power supplier 1030 to the memory controller 1010 may be constant and the memory controller 1010 may change the level of the second power supply voltage VDD2 provided from the power supplier 1030 to the memory 1020. In the drawings, 'CONTROL' means that the level of the second power supply VDD2 provided by the power supplier 1030 is determined under the control of the memory controller 1010.

The memory controller 1010 transfers an 'operation time read command' which requests the memory 1020 for information on the time for performing a read operation. The memory 1020, then, transfers the stored information on the time for performing a read operation. The time for performing a read operation that is transferred from the memory 1020 to the memory controller 1010 may be the same information matched with the second power supply voltage VDD2 as shown in Table 2. The memory controller 1010 receives the time for performing a read operation and determine the performance of the memory 1020 for each level of the second power supply voltage VDD2 that is applied to the memory 1020, and the memory controller 1010 may efficiently control the memory 1020 based on the performance result.

The memory 1020 stores the time for performing a read operation for each level of the second power supply voltage VDD2. This may be carried out by the manufacturer of the memory 1020. Different tests may be performed during the fabrication of a memory, and the manufacturers may store in the memory 1020 information on how long it takes for the memory 1020 to perform the read operation for each level of the second power supply voltage VDD2, after the memory 1020 is fabricated and the read operation of the memory 1020 is tested.

Figure 11:
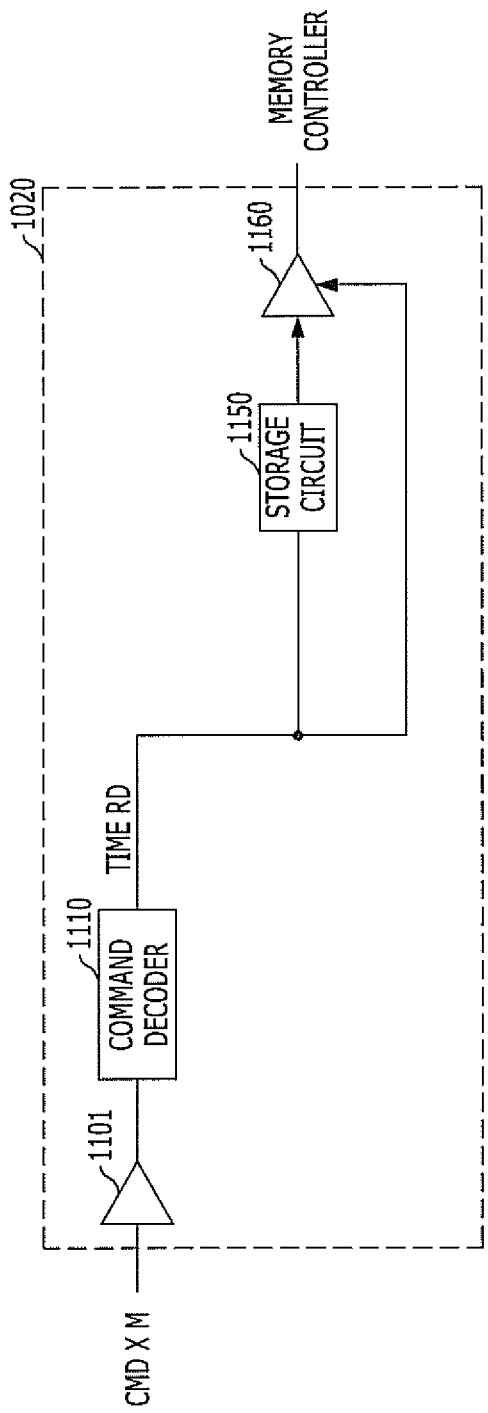
FIG. 11 is a block view illustrating a memory 1020 shown in FIG. 10.

FIG. 11 is a block view illustrating a memory 1020 shown in FIG. 10.

In the drawings, among many constituent elements of the memory 1020, those used for transferring the 'time for performing a read operation' that is stored in the inside of the memory 1020 are described.

Referring to FIG. 11, the memory 1020 includes a buffer 1101, a command decoder 1110, a storage circuit 1150, and an output circuit 1160.

The buffer 1101 receives one or more command signals CMD transferred from the memory controller 1010. In the drawings, 'X M' indicates that there are M number of command signals.

The command decoder 1110 outputs the operation time read command TIME RD by decoding the one or more command signals CMD inputted through the buffer 1101. The operation time read command TIME RD output by the command decoder 1110 is transferred to the storage circuit 1150, and information on the time for performing a read operation which is stored in the storage circuit 1150 is transferred to the memory controller 1010 through the output circuit 1160 in response to the received operation time read command TIME RD.

Since the information stored in the storage circuit 1150, which is the information shown in Table 2, is stored during the fabrication of the memory 1020, a fuse circuit may be used as the storage circuit 1150.

Figure 12:
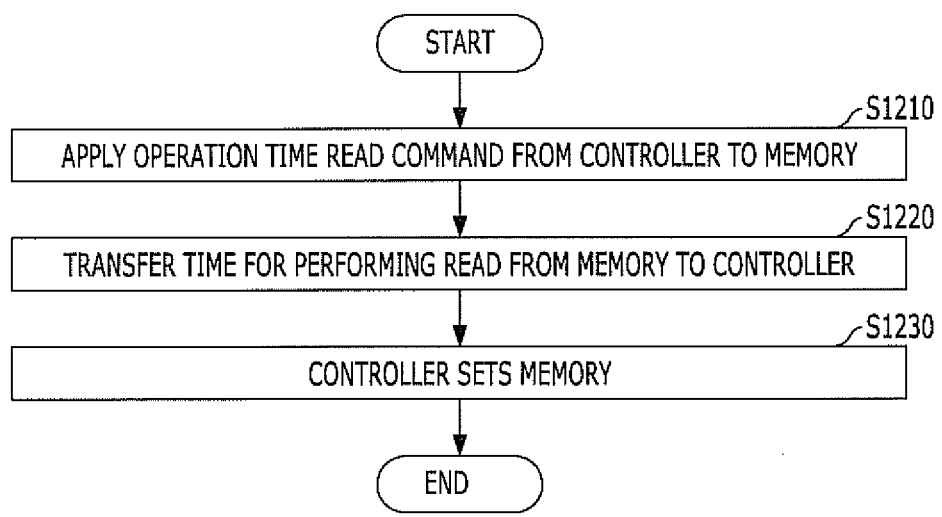
FIG. 12 is a flowchart illustrating an operation of the memory system shown in FIGS. 10 and 11.

FIG. 12 is a flowchart illustrating an operation of the memory system shown in FIGS. 10 and 11. Referring to FIG. 12, the overall operation of the memory system is described.

In step S1210, an operation time read command TIME RD is applied from the memory controller 1010 to the memory 1020. In step S1220, the information stored in the storage circuit 1150 of the memory 1020 is transferred to the memory controller 1010 in response to the operation time read command TIME RD.

In step S1230, based on the information transferred from the memory 1020, the memory controller 1010 sets parameters on the read operation of the memory 1020. For example, when the second power supply voltage VDD2 is at the level of 1.0V, the memory controller 1010 may set the CAS latency of the memory 1020 to 13 clocks. When the second power supply voltage VDD2 is at the level of 1.2V, the memory controller 1010 may set the CAS latency of the memory 1020 to 9 clocks.

Since the read operation is described in the process of the steps S1210 to S1230 while the memory controller 1010 already has information on the read operation performance of the memory 1020, according to an example, the operations of FIG. 12 may be performed in the initial stage of the operations of the memory controller 1010 and the memory 1020.

According to an embodiment of the present invention, the operation speed of a particular operation of a slave chip is measured for each level of the power supply voltage upon a command from a master chip, and the measurement result is transferred to the master chip or the operation speed of the particular operation for each level of the power supply voltage that is stored in the slave chip is transferred to the master chip.

Therefore, the master chip may determine the performance of the slave chip for the particular operation at each level of the power supply voltage, and as a result, the master chip may effectively control the slave chip, such as the latency and operation of the slave chip.

While the present invention has been described with respect to the specific embodiments, it will be apparent to those skilled in the art that various changes and modifications may be made without departing from the spirit and scope of the invention as defined in the following claims.

What is claimed is:

1. A system, comprising:
a first chip configured to supply a training command; and
a second chip configured to transfer to the first chip a measured time for performing an operation in response to the training command.

2. The system of claim 1, wherein the first chip is further configured to control the second chip so that the output of the training command from the first chip and the transfer of the measured time are repeatedly performed for different voltage levels of a power supply voltage supplied to the second chip, respectively.

3. The system of claim 1, wherein the output of the training command from the first chip and the transfer of the measured time are performed in an operation time measurement mode.

4. The system of claim 2, further comprising:
a power supplier configured to supply the power supply voltage to the second chip,
wherein the first chip is further configured to control the supply of the power supply voltage from the power supplier to the second chip.

5. The system of claim 1, wherein the first chip is further configured to set a latency for the operation of the second chip in response the measured time.

6. A system, comprising:
a first chip configured to supply a training command; and
a second chip configured to store a required operation time for an operation corresponding to the training command.

7. The system of claim 6, wherein the supplying of the training command from the first chip and the storing of the required operation time by the second chip are repeatedly performed for different voltage levels of a power supply voltage supplied to the second chip, respectively.

8. The system of claim 7, wherein the required operation time according to each level of the power supply voltage that is stored in the second chip is transferred to the first chip.

9. The system of claim 7, further comprising:
a power supplier configured to supply the power supply voltage to the second chip.

10. The system of claim 8, wherein the first chip sets a latency for the corresponding operation of the second chip based on the required operation time which is transferred from the second chip.

11. An integrated circuit chip, comprising:
a decoder configured to generate a training command by decoding one or more command signals;
an internal circuit configured to perform an operation corresponding to the training command; and
a storage circuit configured to store a measured time for performing the operation.

12. The integrated circuit chip of 11, wherein the integrated circuit chip is configured to support an operation with a power supply voltage of different voltage levels, and
the storage circuit is further configured to store a separate measured time for each one of the different voltage levels of the power supply voltage.

13. The integrated circuit chip of 12, wherein the storage circuit is further configured to transfer the measured time to a control chip that applies one or more command signals to the integrated circuit chip.

14. A method for operating an integrated circuit chip, comprising:
supplying a first power supply voltage to the integrated circuit chip;
outputting a training command to the integrated circuit chip while the integrated circuit chip operates with the first power source voltage;
measuring a first operation time of the integrated circuit chip for performing an operation corresponding to the training command;
storing the first operation time;
supplying a second power supply voltage to the integrated circuit chip;
supplying the training command to the integrated circuit chip while the integrated circuit chip operates with the second power supply voltage;
measuring a second operation time of the integrated circuit chip for performing an operation corresponding to the training command; and
storing the second operation time.

15. The method of claim 14, further comprising:
transferring the first operation time and the second operation time to a control chip that controls the integrated circuit chip.

16. The method of claim 15, wherein the control chip sets a latency for the operation of the integrated circuit chip while being supplied with the first power supply voltage based on the first operation time, and the control chip sets a latency for the operation of the integrated circuit chip while being supplied with the second power supply voltage based on the second operation time.

17. A system comprising:
a first chip configured to perform a predetermined operation; and
a second chip configured to command the predetermined operation of the first chip,
wherein the first chip comprises a storage circuit configured to store a required operation time of the predetermined operation with a power supply voltage of different voltage levels, and the first chip transfers information stored in the storage circuit to the second chip.

18. The system of claim 17, wherein the second chip sets a latency for the predetermined operation of the first chip based on the required time transmitted from the first chip.

19. A memory system, comprising:
a memory configured to transfer a measured data output time from a time when a training command is applied to the memory to a time when data is output in response to the training command; and
a memory controller configured to output the training command to the memory and receive the measured data output time from the memory.

20. The memory system of claim 19, wherein the memory controller is further configured to control the memory so that the output of the training command from the memory controller and the transfer of the measured data output time are repeatedly performed for different voltage levels of a power supply voltage supplied to the memory, respectively.

21. The memory system of claim 19, wherein the output of the training command from the memory controller and the transfer of the measured data output time from the memory are performed in a training mode.

22. The memory system of claim 20, further comprising:
a power supplier configured to supply the power supply voltage to the memory,
wherein the memory controller is further configured to control a voltage level of the power supply voltage.

23. The memory system of claim 20, wherein the memory controller is configured to set column address strobe (CAS) latency of the memory for different voltage levels of the power supply voltage in response to measured data output times for the different voltage levels of the power supply voltage, respectively.

24. A memory system, comprising:
a memory configured to store a measured data output time from a time when a training command is applied to the memory to a time when data is available to be outputted; and
a memory controller configured to output the training command to the memory.

25. The memory system of claim 24, wherein the application of the training command from the memory controller and the storing of the measured data output time by the memory are repeatedly preformed for different voltage levels of a power supply voltage supplied to the memory, respectively.

26. The memory system of claim 25, wherein the measured data output time corresponding to each level of the power supply voltage that is stored in the memory is transferred to the memory controller, and
the memory controller sets a column address strobe (CAS) latency of the memory at each level of the power supply voltage based on the measured data output time at each level of the power source voltage which is transferred from the memory.

27. A memory, comprising:
a cell array region configured to store data;
a command decoder configured to output a training command by decoding one or more signals;
a control circuit configured to generate a data output signal by delaying the training command;
a data output circuit configured to output the data read from the cell array region in response to the data output signal;
a measurement circuit configured to measure a data output time taken from a time when the training command is output to a time when the data is outputted from the data output circuit; and
a storage circuit configured to store the measured data output time.

28. The memory of claim 27, wherein the measurement circuit is further configured to measure a time from a time when the training command is enabled to a time when the data output signal is enabled.

29. The memory of claim 27, wherein the storage circuit is configured to store measured data output times for different voltage levels of a power supply voltage supplied to the memory.

30. The memory system of claim 27, further comprising:
a case decoder configured to determine power supply voltage information indicating a voltage level of power supply voltage applied to the memory by decoding at least one from the group consisting of one or more address signals and one or more command signals,
wherein the storage circuit is configured to match the power supply voltage information to the measured data output time and store the power supply voltage information and the measured data output time.

* * * * *